United States Patent [19]

Blackburn et al.

[11] Patent Number: 5,484,486
[45] Date of Patent: Jan. 16, 1996

[54] QUICK RELEASE PROCESS KIT

[75] Inventors: Greg Blackburn; Donald L. Johnson; Richard McGovern, all of San Jose; Yan Rozenzon, Mountain View, all of Calif.

[73] Assignee: Applied Materials, Inc, Santa Clara, Calif.

[21] Appl. No.: 237,508

[22] Filed: May 2, 1994

[51] Int. Cl.⁶ .................................................. C23C 16/00
[52] U.S. Cl. .......................... 118/728; 118/715; 118/725; 156/345
[58] Field of Search ................................. 118/715, 725, 118/728; 156/345

[56] References Cited

U.S. PATENT DOCUMENTS 4,823,736  4/1989  Post ........................................ 118/728

Primary Examiner—Richard Bueker
Attorney, Agent, or Firm—Peter Sgarbossa

[57] ABSTRACT

This invention is directed to a novel assembly of replaceable parts for use in a substrate processing apparatus. Covers for the substrate processing surface are attached in a plurality of pieces as opposed to a solid piece, for removeability without removing the wafer support pedestals. A ring for surrounding the pedestal includes a fastener enabling the ring to snap in place onto the pedestal. A focus ring for surrounding the pedestal ring attaches to the pedestal ring via a snug fit into a built-in grooved series of notches in the pedestal ring. A novel fastener that enables two articles to snap together is disclosed.

27 Claims, 6 Drawing Sheets

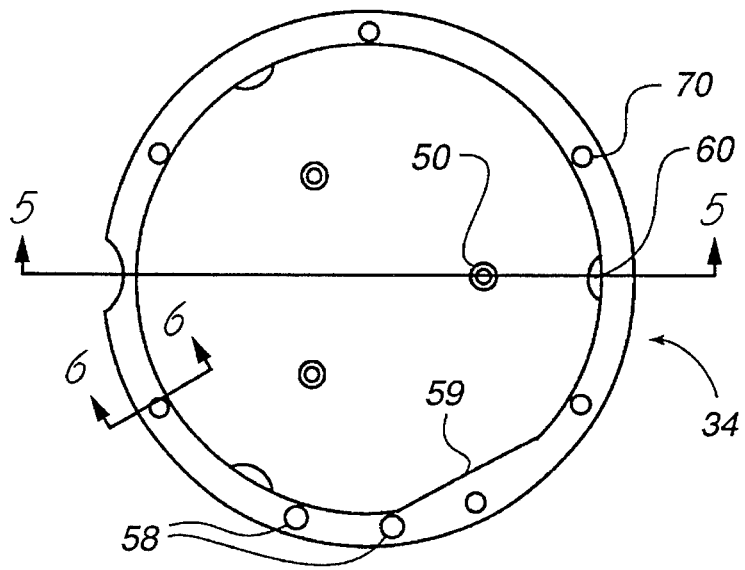
Fig. 4 (PRIOR ART)
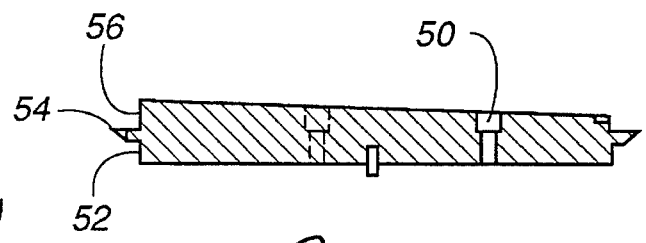
Fig. 6 (PRIOR ART)
Fig. 5 (PRIOR ART)
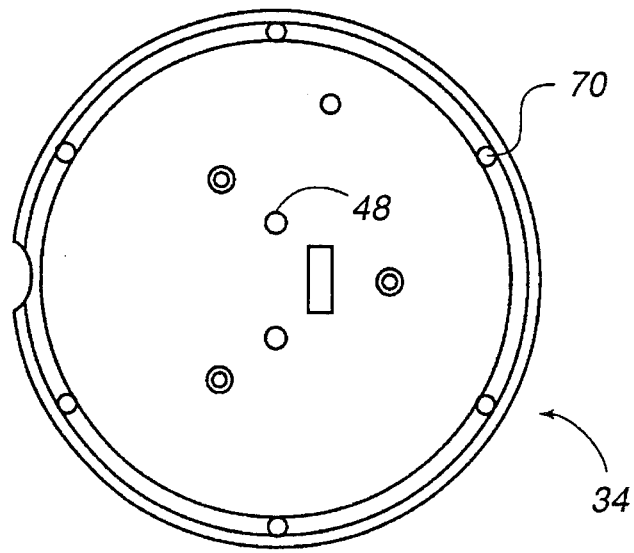
Fig. 7 (PRIOR ART)

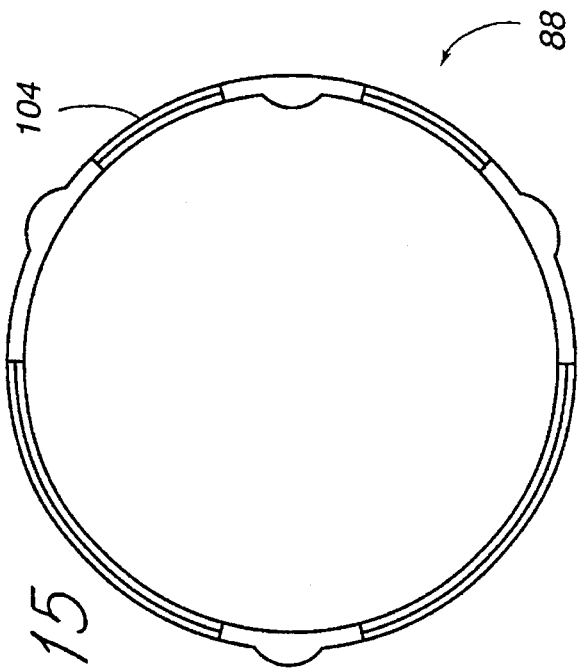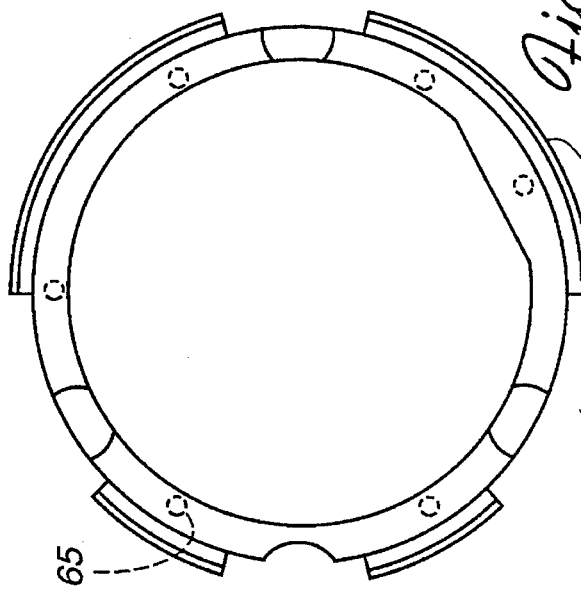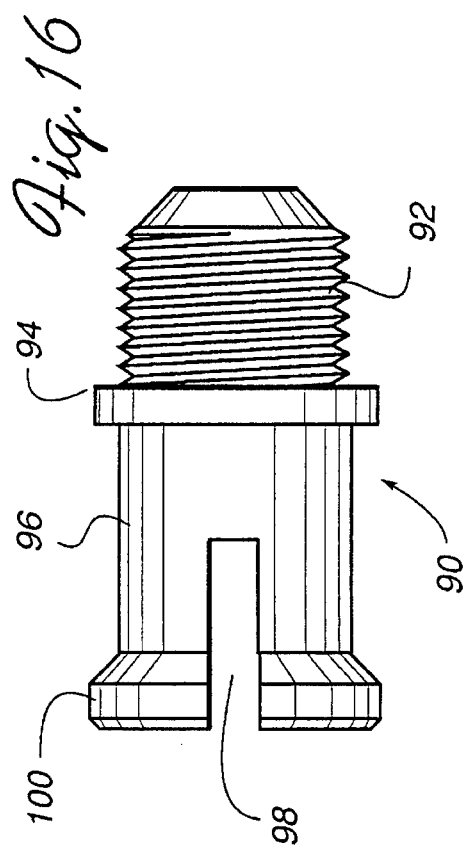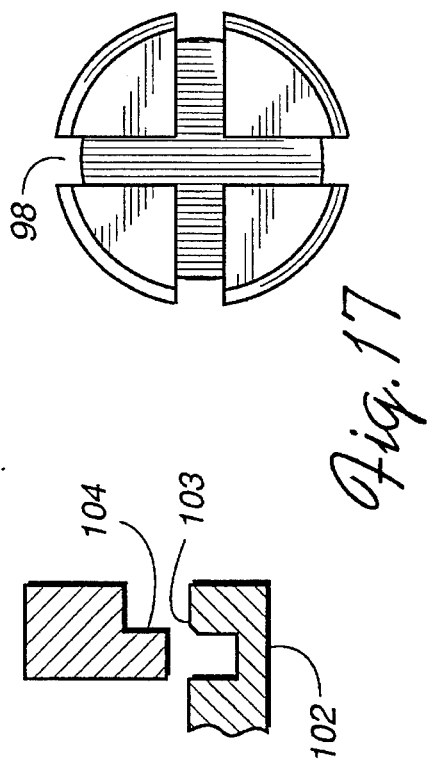

QUICK RELEASE PROCESS KIT

FIELD OF INVENTION

This invention relates to a novel assembly of replaceable parts for use in a plasma processing apparatus. More specifically, the invention relates to an arrangement for facilitating the removal, cleaning and replacement of internal elements of a plasma processing apparatus, including a novel fastener design.

DESCRIPTION OF THE RELATED ART

An important step in the production of semiconductor circuits is plasma etching. Plasma etching involves exposing a substrate containing a film to be etched to a reactive gas, so that the portion of the film exposed to plasma is "etched" or removed, thereby causing a predetermined pattern to form in the film. Plasma etching is generally carried out in a vacuum chamber containing at least one support element to which a wafer is secured, with inlets for gas, an exhaust means, and a power supply to form a plasma of the gas.

One type of plasma etch system is the Applied Materials 8300, where semiconductor wafers are held on pedestals on a "hexode" structure arranged vertically on a multi-surface structure, and in which a large plurality of wafers are batch-processed. This etch system is also an example of a reactive ion etch system, in which etching relies substantially on the bombardment of the surface of the film by reactive gas ions. FIG. 1 is a side view of the interior of a processing chamber 20 of this etch system. The hexode structure 22 constitutes a multi-faced powered electrode acting as a cathode, and includes several vertical arrays of individual wafer pedestals 34 for mounting a number of semiconductor wafers 24 for processing. For example, such a system designed to handle 150 mm diameter wafers will typically include eighteen pedestals, three pedestals in a vertical line on each face of the hexode. Gas is flowed from the gas supply through gas tubes 28 (one of which is shown) which disperse the gas throughout the chamber. A pumping port 30 provides the exit means for the gas. The processing chamber is usually kept under vacuum at all times. For processing wafers, gas is flowed into the chamber, and a pressure of generally less than 200 mTorr is maintained.

An rf power supply 26 connected to the hexode 22 creates electric fields within the processing chamber, ionizing the gas into a plasma of reactive excited gas species and ions. The ions are accelerated toward the wafers 24 on the powered hexode 22. The ions react with the film material on the wafer and form products that evaporate from the wafer surfaces. There is also a certain degree of ion sputtering. Under either mechanism, film from the wafer is removed.

As the ions impinge on parts of the hexode 22, those parts exposed to the ions gradually erode. The excited gas species react and tend to form deposits on the interior surfaces of the chamber 20. With continual processing, the exposed parts of the hexode 22 become worn from ion bombardment and dirty from deposits from the reactive gas. After a number of processing runs, parts of the hexode 22 must be cleaned and, eventually, replaced.

The parts of the hexode 22 that experience the most wear and tear are, obviously, those that are exposed to the plasma. As shown in FIG. 1 these parts include the covers 32 placed on the hexode 22, pedestals 34, and the plastic pedestal ring and focus ring that attach to the pedestal. The pedestal ring is not visible in FIG. 1, but is illustrated in FIG. 8. These parts are collectively referred to as the process kit.

FIGS. 2 and 3 illustrate a prior art solid hexode cover 32 in more detail. For accommodating a 150 mm diameter wafer for metal film etching, the hexode cover 32 is a solid aluminum piece coated with flame sprayed alumina. The dimensions are such that the entire width and length of a face of a hexode 22 can be covered. There are three generally circular cutouts 38 for accommodating pedestals 34, upon which wafers rest for processing. The hexode cover 32 is held against the hexode by a set of eight screws 40, four on either side of the pedestal cutouts 38. For plasma processing, covers usually made of plastic (not shown) are placed on the exposed metal of the screw to shield the exposed metal from the plasma.

The FIG. 3 view of a hexode cover showing cutout 38 shows a fluted shape to the diameter of the cutout 38. Note that the inner diameter 42 of the cutout is smaller than the outer diameter 44 of the cutout 38. The inner diameter 42 of the pedestal cutout 38 is a generally vertical piece extending from the backside of the hexode cover vertically upward. This inner diameter 42 having a vertical inner wall accommodates the bottom part of the pedestal 34, shown in cross-sectional detail in FIG. 3, for a snug fit. At the top of the vertical inner diameter 42, the diameter shifts laterally toward the outside, then angles upward at about 45 degrees from the vertical. The angled diameter 46 further raises the vertical height somewhat, so that the shape of the diameter of the pedestal cutout 38 matches the shape of the pedestal 34, which is illustrated in more detail in FIGS. 4 through 7.

The pedestal 34 is a generally solid, substantially circular piece of aluminum, with hard anodization on all surfaces. Two dowel pins 48 located in the center of the backside of the pedestal 34 fit snugly into two holes in the hexode 22, for initial placement of the pedestal onto the hexode 22. For fastening the pedestal 34 onto the hexode 22, three screws 50 are inserted into holes fabricated within the diameter of the pedestal 34 and extend through the body of the pedestal, and are tightened into receiving holes in the hexode.

The FIG. 5 side view of the pedestal 34 together with the FIG. 3 side view of cutout 38 best illustrates how a pedestal 34 fits into a pedestal cutout 38 of the hexode cover 32. The pedestal 34 has a bottom diameter 52 which remains constant vertically upward, then bends laterally and horizontally outward for a distance, then angles upward at about 45 degrees. From the top of the angled edge 54, the diameter of the pedestal turns laterally inward extending for a distance to accommodate a pedestal ring, then turns vertically upward to form an inner top diameter 56. It is across the inner top diameter 56 surface of the pedestal 34 that a wafer rests for processing. The vertical bottom diameter 52 of the pedestal snugly fits into the vertical distance of the inner diameter 42 of the hexode cover pedestal cutout 38. The outer angled edge 54 portion of the pedestal fits against the matching outer diameter portion of the hexode cover 32, so that the outer diameter 44 portion of the cutout 38 is essentially held behind the outer diameter 44 portion of the pedestal. Because the pedestal hangs outside the edge of cutout 38, the hexode cover 32 must always be placed onto the hexode before the pedestals 34 are installed and, conversely, to remove the hexode cover 32 the pedestals 34 must be removed first. One can appreciate that, with the number of pedestals in such batch etchers, in this exemplary system eighteen pedestals, all of which must be removed before the hexode covers can be removed, the process of removing hexode covers for cleaning can be very time consuming.

Placement of each wafer 24 on an individual pedestal 34 for processing is done via robot in a high-precision operation requiring strict alignment of a robot arm with the pedestal, as described in U.S. Pat. No. 5,224,809 assigned to Applied Materials. Basically, each wafer 24 is carried by a three-fingered grip robot arm to each pedestal 34. The pedestal 34 is provided with two outwardly-protruding holding pins 58 for edgewise support of a wafer upon the pedestal. The pedestal face is angled 2 degrees from the vertical hexode, so that the wafer 24, when placed on the support pins 58, can fall slightly backward against the face. Then as the wafer rests on the two pins 58, it is held flat against the pedestal face by gravity. As the robot arm approaches a pedestal, the three fingers of its gripper must align with the three shallow gripper indentations 60 (FIG. 4) on the pedestal. The fingers extend into the indentations 60 until the fingers press against the indentation bottom. The wafer is carried past the support pins 58, whereupon the fingers loosen their hold on the wafer. Assuming the alignment of the robot arm to the pedestal is sufficiently accurate, then when the wafer is released, it is caught by the gravitational support pins and the robot arm retracts.

The remaining parts of the process kit can be described by reference to FIGS. 8, 9, and 10. FIG. 4 shows a pedestal ring 62. The pedestal ring 62 is generally made of lexan. It is molded with an inner diameter 64, an outer diameter 66 and a height to accommodate the inner top diameter 56 portion of the pedestal 34. The pedestal ring 62 is cut to fit the shape of the pedestal, including a flat portion 67 to fit the flat on the pedestal 59 for accommodating the flat on a wafer. When the pedestal ring 62 is placed on the pedestal 34 it forms a collar around the face of the pedestal against which the wafer is supported. The pedestal ring 62 is attached to the pedestal through six holes 65 via six standard screws 68 (shown in FIG. 10). The screws are driven into the six matching holes 70 (FIG. 4) from the backside of the pedestal 34 in the horizontally outward extending lip portion of the pedestal 34 and then driven into the six holes 65 in the backside of the pedestal ring 62.

The focus ring 72 of FIG. 9 is a device for improving etch rate uniformity of a wafer. Typically made from lexan, it is essentially an outward-jutting extension of the pedestal ring 62, rising about 5 cm above the plane of the pedestal 34 top surface. The focus ring contains three bubbles 75 for accommodating the gripper fingers of a robot arm for delivering and removing a wafer. The focus ring 72 fits around the perimeter of the pedestal ring 62 and is fastened onto the pedestal ring 62 by two screws 80 which are driven through holes drilled radially through the focus ring to match with holes 82 drilled radially through the pedestal ring.

Periodically, the process kit in all such etching systems must be cleaned by manual wiping with a solvent and a clean cloth. Since it is not feasible to clean between tight spacings of the fittings of the process kit, it is necessary to remove the process kit for proper cleaning. Removal and replacement of the process kit can be a very slow, time consuming process. Each hexode cover 32 must be removed by removing the eight screws 40 per hexode cover 32. Prior to removing a hexode cover 32, each pedestal 34 attached to its face must be removed. This involves removing the three screws 50 for each pedestal. The pedestal ring 62 detaches from the pedestal 34 by loosening each of the six screws 68 that hold the pedestal ring against the pedestal. The focus ring 72 detaches from the pedestal ring by loosening of the two screws 80 that hold the focus ring 72 to the pedestal ring 62. When cleaning of the process kit parts is completed, each part must be replaced. The focus rings 72 must be screwed into the pedestal rings 62, the pedestal rings 62 must be screwed into the pedestals 34, the hexode covers 32 must be screwed onto the hexode, and the pedestals 34 must be screwed into the hexode. Every time tools are used to attach and detach process kit parts, damage can occur to a part from the tools, rendering the part unusable.

With so many steps involved in removing and cleaning the typical process kit, it will be appreciated that routine maintenance can take a significant amount of time and effort. It would be advantageous to reduce the time and effort by simplifying the steps involved. It will also be recalled that the hexode covers 32 must be installed onto the hexode 22 prior to installation of the pedestals 34, because an outer diameter portion on the pedestals overlaps somewhat the diameter of the pedestal cutout openings in the hexode covers. Sometimes this is forgotten, causing unnecessary delay in reinstalling the process-kit. Moreover, the pedestals 34 do not have to be removed at all for the manual clean. The parts of the pedestal generally are shielded from the plasma, because the pedestal is covered by a wafer 24, pedestal ring 62 and focus ring 72. Hence, the pedestal 34 does not become so worn and dirty as those parts that are exposed to plasma, such as the pedestal ring 62, focus ring 72, and hexode covers 32. It is usually sufficient therefore to clean the pedestals 34 by wiping them while they remain on the hexode 22. Yet, in the prior art process kit, they must be removed in order to remove the hexode covers 32. It would be advantageous to eliminate this sensitivity to the order of installing the hexode covers and pedestals.

Moreover, the cleaning process does not end with replacement of the items of the process kit. It will be recalled that each of the eighteen wafers of a 150 mm diameter wafer system is loaded onto the pedestals by a robot. Each pedestal face is essentially vertical because of the vertical hexode, and the area of the pedestal face corresponds nearly exactly with the area of the wafer. The area correspondence is so precise that there is even a flat portion 59 on the pedestal face to accommodate the flat on the wafer. If the wafer placement on the two pins 58 at the bottom of each pedestal is at all off center, the wafer may sit crookedly on the pedestal 34, or not cover it-completely, or not be positioned completely flat against the pedestal face. Improper placement of a wafer can lead to various processing problems, such as etch rate nonuniformity, photoresist burning, arcing of the plasma, and exposure of the pedestal surface to the plasma.

To ensure proper centering of a wafer on each of the pedestals 34, as well as proper alignment of the robot fingers with pedestal indentations 60, the robot must be precisely aligned with the position of each pedestal. But every time a pedestal 34 is removed and replaced, the position of the pedestal 34 on the hexode is usually slightly altered from before, so the robot must be realigned for the pedestal 34. Realignment of the robot is a laborious, time consuming process. If the step of realigning the robot could be eliminated from the process kit cleaning, a significant amount of time would be saved.

SUMMARY OF INVENTION

It is an object of the invention to provide, for use in an apparatus for processing of substrates within a reactive gas environment, and which contains a substrate processing surface, an improved combination of interrelated elements which cooperate together in a superior way as a process kit having heretofore unobtainable advantages.

It is a further object of the invention to reduce the amount of time required for dismantling and reassembly of apparatus for processing substrates for purposes of periodic cleaning or maintenance of the processing system or parts.

It is yet a further object to minimize the necessity of using tools in the assembly and disassembly to avoid damage to process kit parts which need to be cleaned or replaced.

It is another object of the invention to permit cleaning and replacement of disposable elements without necessarily disturbing the pedestals for mounting of the substrates.

It is yet another object of the invention to provide a snap fastener arrangement to enable elements to be quickly and without the use of tools dismantled for cleaning or replacement and reassembled.

In one aspect of the invention, these objects are achieved by providing at least one substrate-supporting pedestal that is removeably mounted to the processing surface, and a cover assembly removeably mounted to the processing surface to protect the surface from the effects of the reactive gas environment typically found within the processing apparatus. Mounted to the pedestal about the pedestal periphery is a ring assembly means. The ring assembly means is assembled with the pedestal via a novel fastener arrangement, wherein on one of the pedestal or ring, protruding fasteners are securely mounted while on the other, a complementary fastener engagement means is provided, so that the ring assembly and pedestal can be snapped together or apart.

In another aspect of the invention, a cover assembly is configured to be removeably mountable to the processing surface to protect the processing surface from the effects of the processing environment. The cover assembly includes a plurality of elements arranged about pedestal locations so that the cover assembly does not cover a pedestal, and to permit the cover assembly elements to be removed without removing a pedestal.

In a further aspect of the invention, the ring assembly is further designed with arcuate grooves about its periphery, so that the ring assembly can accommodate a focus ring that slides snugly into the arcuate grooves for easy assembly.

In yet another aspect of the invention, a snap fastener arrangement for removeably but securely holding together two articles is provided. An elongated fastener member is securely mounted within one article, and extends from a surface thereof. The member has a leading portion terminating in a leading end. The leading end has a first lateral dimension, while the remainder of the leading portion has a second lateral dimension smaller than the first lateral dimension. The member is provided with axially directed slots defined at least within the leading end, so as to render at least the leading end radially compressible. An opening in the surface of the other article to receive the first and second dimension of the elongated fastener member provides a complementary fastener means. The opening has a configuration to accommodate the first and second dimension of the fastener elongated members. The opening also has a third lateral dimension smaller than the first lateral dimension, as well as a depth equal to or less than the axial length of the second lateral dimension portion of the fastener member. This arrangement then enables the two articles to be snapped together by inserting the fastener member into the opening until at least the leading end of the fastener member has passed through the opening.

In this manner an interrelated combination functioning together as a process kit for use in reactive gas processing environments is provided with a number of previously unobtainable advantages. Because of the flexibility of all of the traditional elements of the process kit now being readily demountable, much time is saved during routine cleaning and maintenance. The use of tools is now kept to a minimum, since the focus rings can simply be pulled away, while the pedestal rings can be snapped off the pedestals. Likewise the reverse can be done during reassembly. And because the cover assembly is designed to permit disassembly in pieces, there is no need to remove the pedestals before removing the cover plates. Not only is time saved in servicing the cover plates, but a great deal more time is saved by avoiding the need for realignment of the automated robot substrate loaders with the pedestals.

BRIEF DESCRIPTION OF THE DRAWINGS

FIG. 4 is a top view of a pedestal for holding a semiconductor wafer.

FIG. 5 is a side view of the pedestal featured in FIG. 4.

FIG. 6 is a magnified view of the edge of the pedestal, showing an opening for accommodating a fastener in a pedestal ring.

FIG. 7 is a backside view of the pedestal.

FIG. 13 is a top view of the pedestal ring of the present invention.

FIG. 14 is a cross-sectional view of how the groove of the pedestal ring and lip of the pedestal ring are fit together.

FIG. 15 is a top view of the focus ring of the present invention.

FIG. 16 is a side view of the snap on fastener design of the present invention.

FIG. 17 is a top view of the snap on fastener, showing the slots.

DETAILED DESCRIPTION OF THE PREFERRED EMBODIMENTS

The present invention is directed to a new easily mountable and demountable arrangement for the consumable parts of a plasma processing apparatus, including a novel snap fastener enabling two articles to snap together. In a typical application, such consumable parts or "process kit", have been described above as including a cover for the hexode to protect the hexode from exposure to plasma; a wafer support pedestal 34; a ring 72 that surrounds a cutout edge of the wafer support pedestal; and a focus ring 62 that surrounds the pedestal for "focusing" the plasma. The complexity of the steps typically involved in disassembling and reassembling a typical prior art process kit has also been reviewed. The simplified design of the present invention and its improved process kit can now be appreciated by reference to FIGS. 11, 12, 13, 14, 15, 16 and 17.

Figure 1:
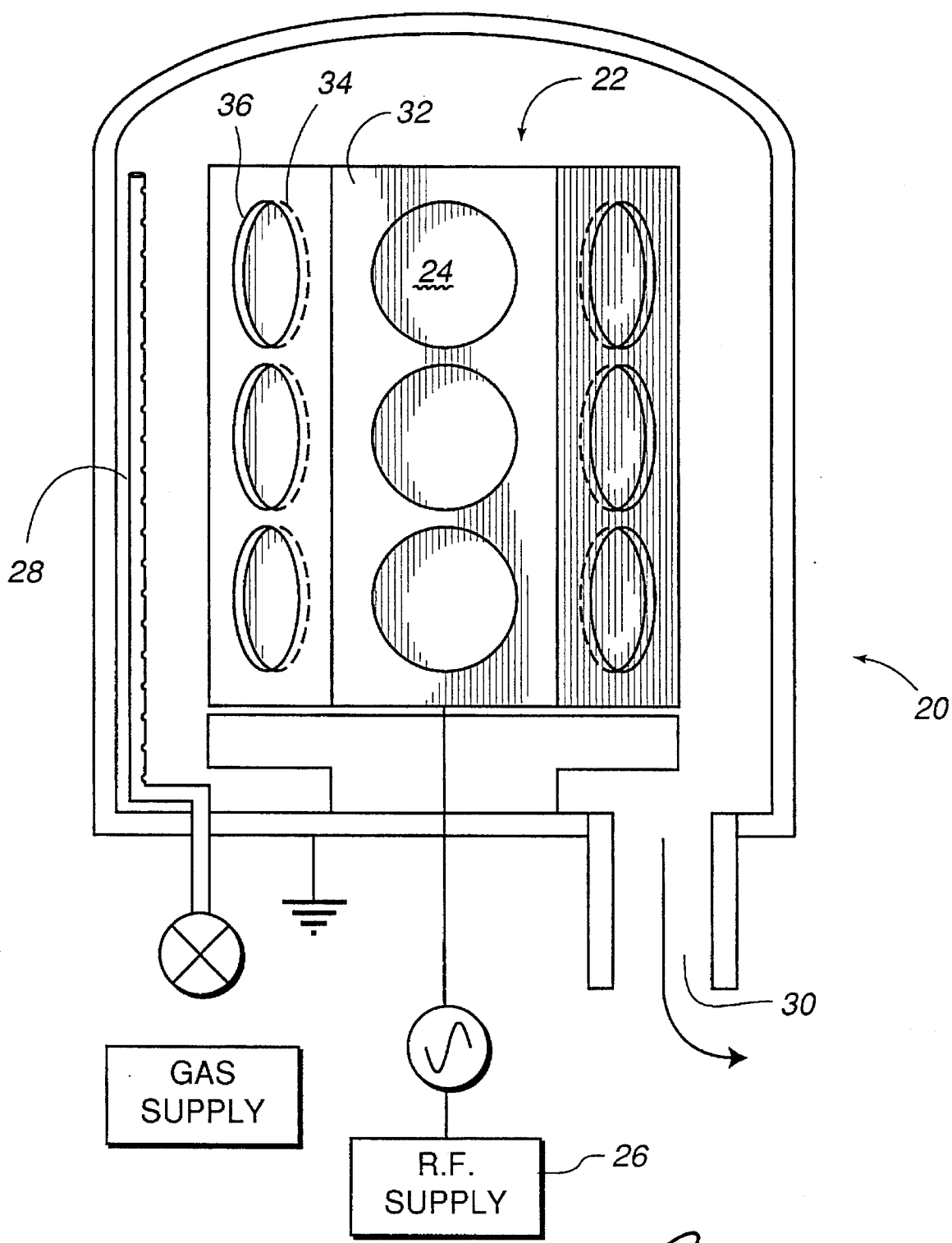
FIG. 1 is a side view of the interior of a processing chamber, featuring a hexode with the process kit installed.
Figure 2:
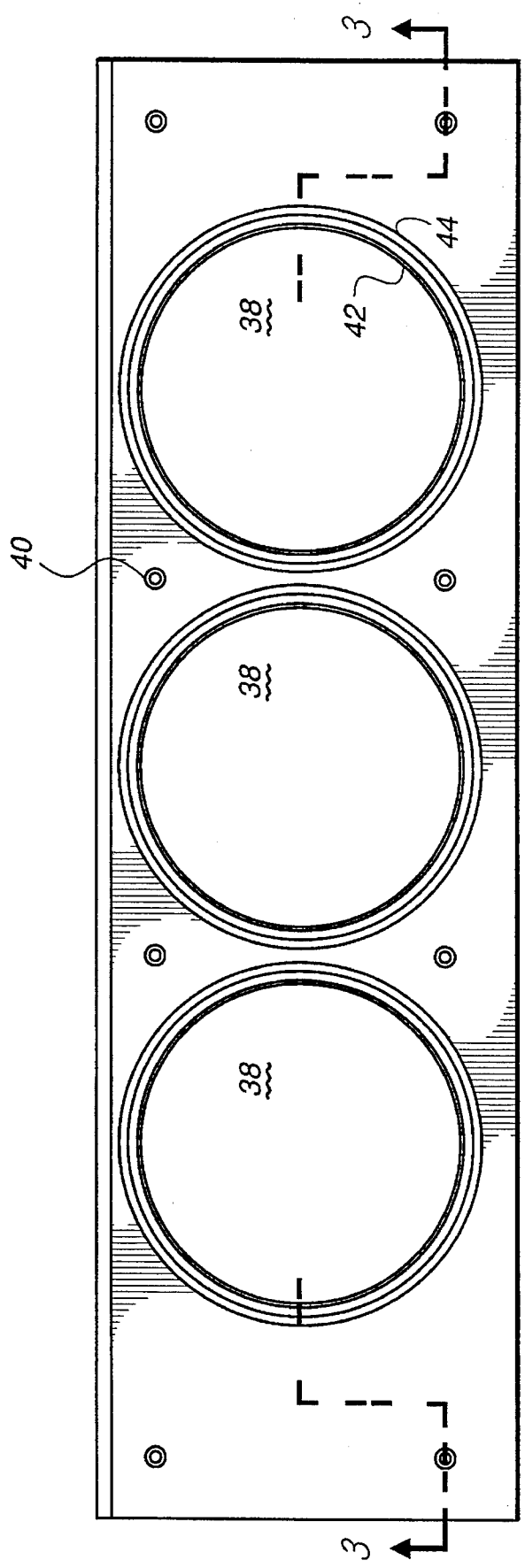
FIG. 2 illustrates a prior art hexode cover with three openings to accommodate three pedestals.
Figure 3:
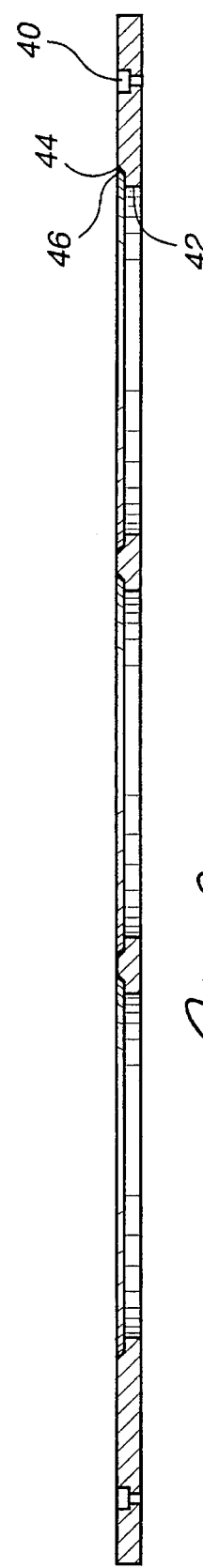
FIG. 3 is a side view of the prior art hexode cover.
Figure 8:
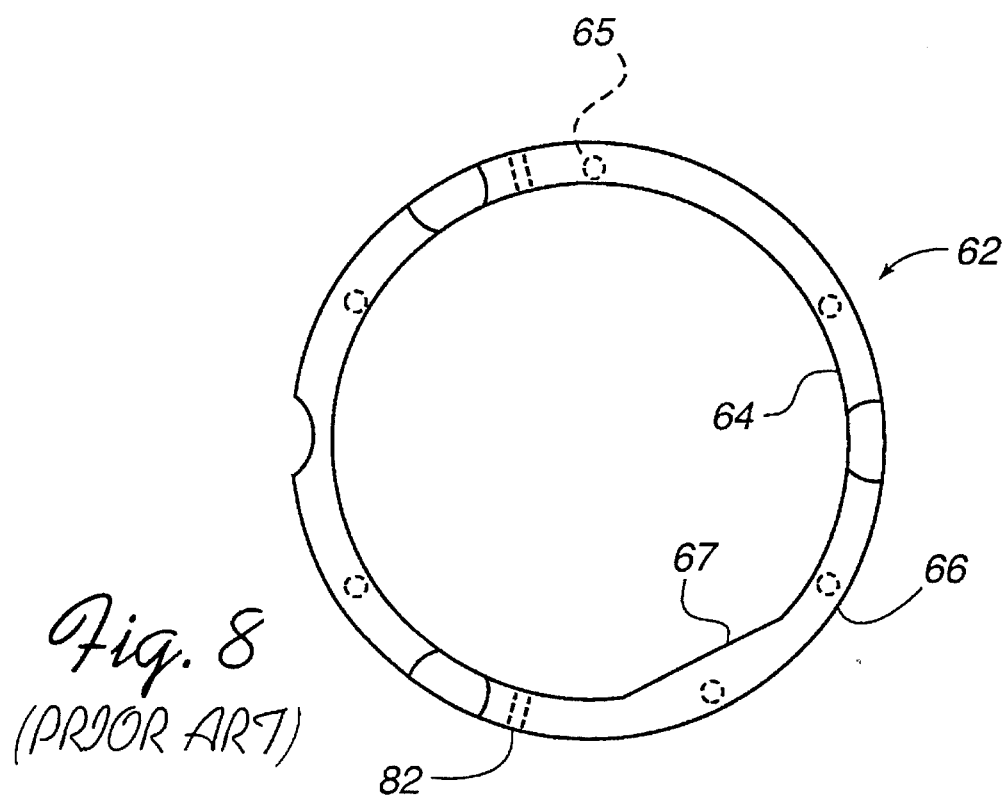
FIG. 8 is a top view of a prior art pedestal ring that fits peripherally around the processing surface of the pedestal.
Figure 9:
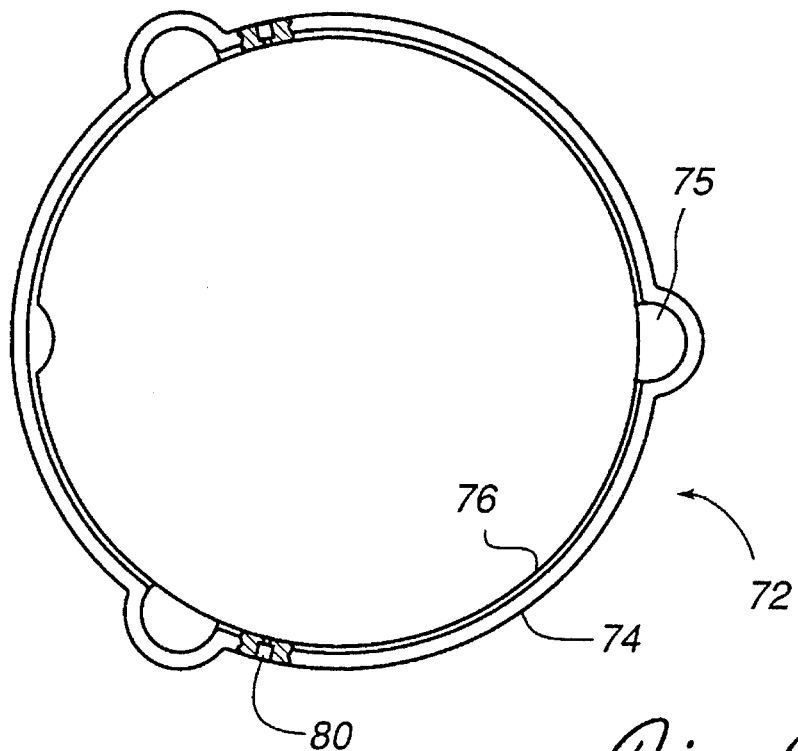
FIG. 9 is a top view of a prior art focus ring.
Figure 12:
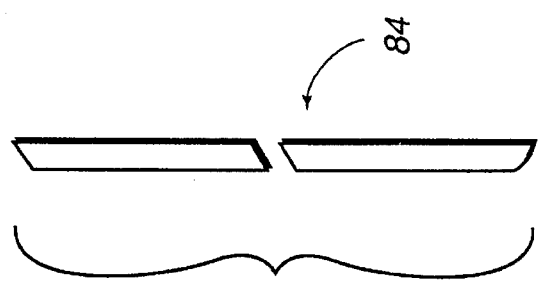
FIG. 12 is an end view of the split hexode cover of the present invention.
Figure 10:
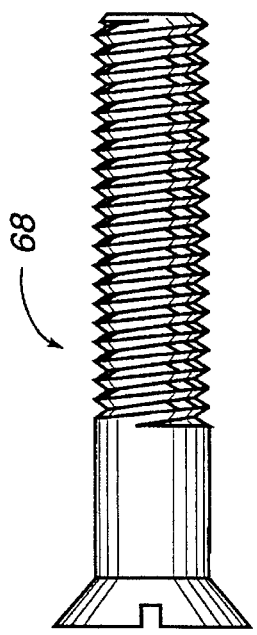
FIG. 10 illustrates a prior art standard screw used for assembling the prior art process kit.
Figure 11:
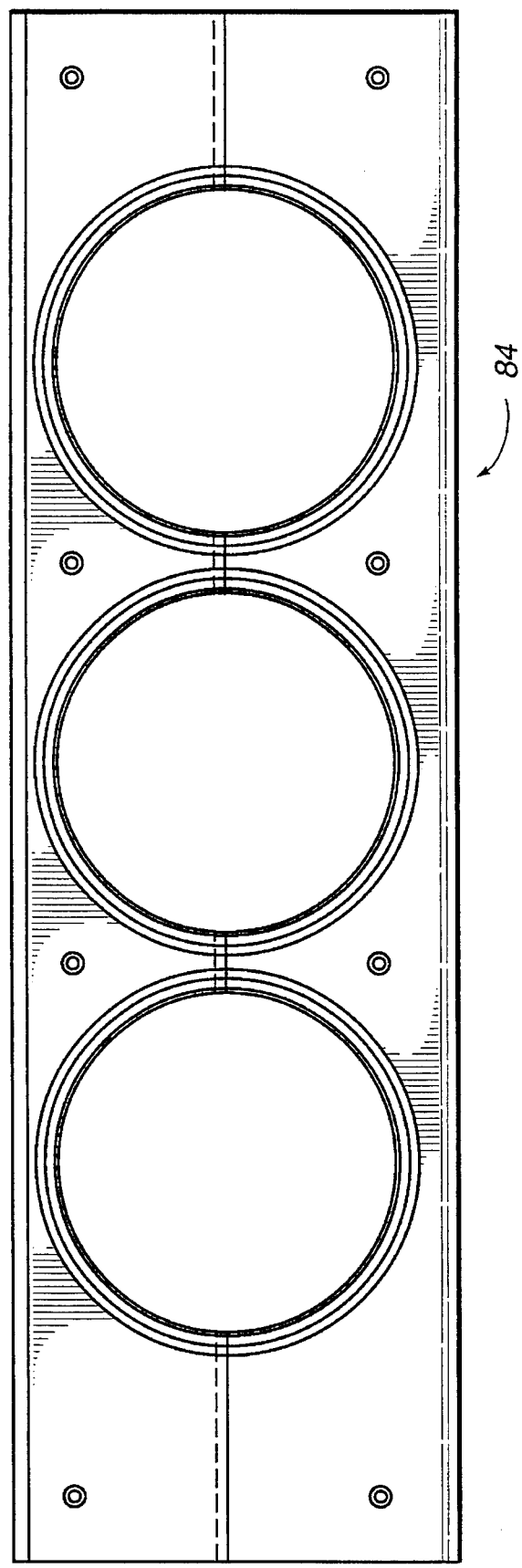
FIG. 11 is a top view of the split hexode cover of the present invention.

FIG. 11 illustrates the design for the improved hexode cover 84. The new hexode cover 84 is sliced down the middle, the slice extending the length of the cover. As best shown in FIG. 12, which is a side view of one end of the improved hexode cover 84, the slice is machined to be at an angle, which for this example is 30 degrees from the vertical. The reason for the angled cut is to prevent arcing of the plasma. With the hexode cover in two parts, each half can be removed separately. A further benefit of the design is that each half can be removed and replaced around the pedestals 34, so that the pedestals 34 do not have to be removed to remove the hexode covers. Since the pedestals can remain in their original position while the hexode covers 84 are removed or replaced, the previously described problem of the robot which delivers and removes wafers to the pedestal having to be realigned with the pedestals does not arise. Having the ability to remove the hexode covers without removing the pedestals therefore saves a substantial amount of time.

FIGS. 13, 14 and 15 illustrate the new pedestal ring 86 and new focus ring 88. A main advantage is that the two rings may now simply be snapped together, thereby saving assembly and disassembly time and also making tools unnecessary, thereby removing the risk of damage to the parts from handling with tools. Four radially extending grooved extension members 102 are molded onto the pedestal ring 86 to accommodate the focus ring upon the pedestal ring. The grooves are curved to match the curvature of the focus ring 88. The grooved pedestal extension 102 is approximately the width of the focus ring 88. To fit into the grooves of the pedestal ring 86, the focus ring 88 defines four lip extension pieces 104 (FIG. 15) that dimensionally match the grooves of the pedestal ring for a tight fit, as illustrated in the cross-sectional view of FIG. 14. As shown in FIG. 14 the tip of the outer wall of the groove 103 is flared outwardly by about 15 degrees to guide the focus ring 88 into engagement with pedestal ring 86.

For assembly of the focus ring 88 with the pedestal ring 86, the focus ring 88 is simply aligned with the grooves of the pedestal ring, then the pedestal ring and focus ring are pressed together until the plastic of the four lip extension pieces 104 fills the four groove pieces 102. Note that because assembly can be done by simply pressing the parts together, the fastening screws 80 of the prior art assembly are no longer required.

Instead of having a number of standard screws to tighten in order to fasten the pedestal ring 86 onto the pedestal 34, six snap-on screw-like fasteners 90 (see FIG. 16 and 17) are pre-installed into holes 65 in the backside of the pedestal ring 86 at the locations indicated in FIG. 13 for easy snapping into the pedestal 34. Pre-installation into of the fasteners 90 into the holes 65 can be carried out in any manner to provide a secure attachment to the pedestal ring 86. In the preferred embodiment, the holes 65 are threaded and the fasteners 90 are screwed into the threaded holes 65. As shown in detail in FIG. 16, the snap-on fasteners 90 have threading in the bottom portion 92 of the fastener for initial installation into the pedestal ring 86. The threading extends a length of about one half the length of the fastener, ending at a first flange 94 at about midpoint to stop the fastener from being inserted farther than the length of the threading. The head or leading portion 96 of the fastener has a total length that is about equivalent to the length of the threaded portion, but has no threading, having instead a chamfered tip and a smooth outer diameter slightly smaller than the flange. Slots 98 are provided through about half of the length of the leading portion 96 of the fastener so that when viewed end-on, a cross is defined (FIG. 17). The slots 98 are dug to a depth sufficient to allow compression of at least the terminal or leading end 108 of the leading portion of the fastener; in the preferred embodiment the depth is to about the midpoint of the leading portion of the fastener. These slots 98 are important to the snap-on feature of the fastener, because the slots 98 enable compression and flexing of the leading portion 96 as the leading portion 96 is guided through a tight opening. The leading end 108 of the leading portion 96 of the fastener is chamfered. In the preferred embodiment, the leading end 108 extends about one quarter into the length of the leading portion 96 of the fastener and juts radially outward to define a second flange 100 of a diameter that is about the same diameter as that of first flange 94. The leading and trailing edges of second flange 100 of the fastener are chamfered at a 45 degree angle so that the fastener 90 can be guided into the hole 70 (shown in detail in FIG. 6) in the pedestal for accommodating the fastener. The opening of hole 70 is approximately the same diameter as the smooth diameter portion of the fastener 90, that is, that part of the leading portion 96 that lies between the leading end 108 and first flange 94. Hole 70 is machined to be approximately the same diameter as the smooth diameter portion of the leading portion of the fastener. The hole extends for a distance that is less than or equal to the length of the smooth diameter portion of the leading portion 96, that is, that part of the leading portion 96 that lies between the leading end 108 and first flange 94, then at the terminal end of the hole 70 it flares outward at an angle of 45 degrees to match the beveling of the chamfered leading end. The flange 94 in the fastener limits the amount by which the fastener 90 can sink into the pedestal hole 70 and pedestal ring hole 65.

To operate the snap-on feature of the pedestal ring 86, the threaded ends of the six snap-on fasteners 90 are initially screwed into the holes 65 in the pedestal ring 86. With the heads of the fasteners facing the pedestal 34, the pedestal ring 86 is placed lightly onto the pedestal 34, then pushed against it, the fasteners snapping into their respective matching holes.

Assembly of the process kit of the invention is as follows. The hexode covers 84 are screwed into the hexode 22. The eighteen pedestals 34 are then pressed onto the hexode 22 by the dowel pins 48, then are screwed in by the three screws 50 within the pedestal diameter. Note that the steps of installing the hexode covers 84 and the pedestals 34 can be reversed, as the order of installation is not important with the split hexode covers 84. The pedestal rings 86 are snapped onto the pedestals 34, and the focus rings 88 are fit-pressed into the grooves 102 of the pedestal rings 86. Following this procedure, since the pedestals have been newly installed, the robot for loading and unloading wafers into the system must be aligned with each newly installed pedestal as described previously.

For cleaning or replacement of parts, the focus rings 88 are pulled off the pedestal rings 86, then the pedestal rings 86 are pulled off the pedestals 34. Alternatively, the pedestal rings 86 can be pulled off the pedestals 34, and separated from the focus rings 88 later. The hexode covers 84 are unscrewed and each half is pulled out from under the pedestals 34. The pedestals 34 remain in place. The pedestals 34 can be wiped down while they are on the hexode. The process kit parts are replaced in the opposite order from which they are removed. Because the pedestals 34 are not removed, realignment of the robot is not needed.

It should be noted that, although the invention has been described in the context of plasma etching of semiconductor wafers, the invention is by no means limited to that context, and is applicable to any context reasonably obvious to a person skilled in the art who can appreciate the disclosure. The invention is therefore not limited to the context of semiconductor wafer processing, nor is it limited to plasma reactors, etching systems, or hexode electrodes. Further, the snap on fastener design can be used for any application in which quick mounting and disassembly of a combination of elements is necessary, yet which requires the elements to be held securely together during use.

We claim:

1. In an apparatus for processing of substrates within a reactive gas environment, said apparatus including a processing surface, the improvement comprising:

a cover assembly removeably mounted to said processing surface to protect the processing surface from the effects of substrate processing;

at least one substrate-supporting pedestal removeably mounted on said processing surface; and ring means for removeable mounting upon said pedestal about the pedestal periphery, one of said pedestal or ring means peripherally mounting one or more protruding fasteners, with the other of said pedestal or ring means being provided with complementary fastener engagement means, said fasteners and complementary fastener engagement means being configured to enable the ring means and pedestal to be snapped together or apart for instant engagement or disengagement as desired, whereby the ring means may be easily and quickly mounted and demounted for cleaning and replacement without disturbing the pedestals, as well as to permit quick access to the pedestals when the pedestals require cleaning or replacement.

2. The improvement of claim 1, in which said cover assembly is comprised of a plurality of elements arranged about pedestal locations so that the cover assembly does not cover a pedestal, and to permit the cover assembly elements to be removed without removing a pedestal.

3. The improvement of claim 1, wherein said ring means includes a focus ring for mounting about said ring means and axially extending beyond said ring means away from the pedestal, said ring means including at least one radially extending lip provided with an arcuate groove matching the curvature of the periphery of the focus ring, the focus ring having at least one arcuate axially extending member for engagement within said groove, such that said ring means and focus ring can be removeably engaged.

4. The improvement of claim 1, in which at least the leading end of said fastener is compressible at least radially, and in which said complementary fastener engagement means provides an opening of a size which can accommodate said leading end when said leading end is in its compressed state.

5. The improvement of claim 4, in which at least the leading end of said fastener is comprised of several elements which are inwardly radially bendable, and in which said complementary fastener engagement means provides an opening of a size which can accommodate said leading end when said leading end elements are in their inwardly bent state.

6. The improvement of claim 4, in which said leading end elements are axially elongated members.

7. The improvement of claim 6, in which said leading end is axially elongated and is of generally cylindrical configuration.

8. The improvement of claim 6, in which said leading end is shaped about its periphery, to ease insertion and removal.

9. The improvement of claim 6, in which said leading end is chamfered at its periphery, to ease insertion and removal.

10. In an apparatus for processing of substrates within a reactive gas environment, said apparatus including a processing surface, the combination comprising:

at least one substrate-supporting pedestal removeably mounted on said processing surface;

ring means for removeable mounting upon said pedestal; and a cover assembly removeably mounted to said processing surface to protect the processing surface from the effects of the environment, said cover assembly comprising a plurality of elements arranged about pedestal locations so that the cover assembly does not cover a pedestal, and to permit the cover assembly elements to be removed without removing a pedestal.

11. The combination of claim 10, wherein said ring means includes one or more protruding fasteners peripherally mounted on one of said pedestal or ring means, with the other of said pedestal or ring means being provided with complementary fastener engagement means, said fasteners and complementary fastener engagement means being configured to enable the ring means and pedestal to be snapped together or apart for instant engagement or disengagement as desired, whereby the ring means may be easily and quickly mounted and demounted for cleaning and replacement without disturbing the pedestals, as well as to permit quick access to the pedestals when the pedestals require cleaning or replacement.

12. The combination of claim 10, wherein said ring means includes a focus ring for mounting about said ring means and axially extending beyond said ring means away from the pedestal, said ring means including at least one radially extending lip provided with an arcuate groove matching the curvature of the periphery of the focus ring, the focus ring having at least one arcuate axially extending member for engagement within said groove, such that said ring means and focus ring can be removeably engaged.

13. The combination of claim 11, in which at least the leading end of said fastener is compressible at least radially, and in which said complementary fastener engagement means provides an opening of a size which can accommodate said leading end when said leading end is in its compressed state.

14. The combination of claim 13, in which at least the leading end of said fastener is comprised of several elements which are inwardly radially bendable, and in which said complementary fastener engagement means provides an opening of a size which can accommodate said leading end when said leading end elements are in their inwardly bent state.

15. The combination of claim 14, in which said leading end elements are axially elongated members.

16. The combination of claim 15, in which said leading end is axially elongated and is of generally cylindrical configuration.

17. In an apparatus for processing of substrates within a reactive gas environment, said apparatus including a substrate processing surface, the combination comprising:

at least one substrate-supporting pedestal removeably mounted to said processing surface;

a cover assembly removeably mounted to said processing surface to protect the surface from the effects of the reactive gas environment, said assembly being comprised of a plurality of elements arranged about pedestal locations so that the cover assembly does not cover a pedestal, and to permit the cover assembly elements to be removed without removing a pedestal;

ring assembly means for mounting upon the pedestal about the pedestal periphery, one of said pedestal or ring assembly means peripherally mounting one or more protruding fasteners, with the other of said pedestal or ring assembly means being provided with complementary fastener engagement means, said fasteners and complementary fastener engagement means being configured to enable the ring assembly means and pedestal to be snapped together or apart, for instant engagement or disengagement as desired, whereby the ring assembly means and cover elements may be easily and quickly mounted and demounted for cleaning and replacement without disturbing the pedestals, as well as to permit quick access to the pedestals when the pedestals require cleaning or replacement.

18. The combination of claim 17, in which said ring assembly includes a pedestal ring having an inner diameter approximating the outer diameter of the protruding end of the pedestal and forming a collar about the exposed periphery of the pedestal to protect same against the processing environment, said assembly further including a focus ring for mounting about said pedestal ring and axially extending beyond said pedestal ring away from the processing surface, one of said ring elements including at least one radially extending lip provided with an arcuate groove matching the curvature of the periphery of the other ring element, the other of said ring elements having at least one arcuate axially extending member for engagement within said groove, such that said ring elements can be removeably engaged into said ring assembly.

19. The combination of claim 17, wherein said fastener is provided with a leading portion terminating in a leading end, said leading end having a first lateral dimension, the remainder of said leading portion having a second lateral dimension smaller than said first lateral dimension, and in which said complementary fastener engagement means is an opening having a third lateral dimension smaller than said first lateral dimension, said opening having a depth equal to or less than the axial length of the second lateral dimension portion of the fastener member.

20. The combination of claim 19, in which at least said fastener leading end is compressible so as to permit said leading end to be forced into said opening of smaller diameter than said fastener leading end.

21. The combination of claim 20, in which said leading end is shaped about its periphery, to ease insertion and removal.

22. The combination of claim 20, in which said leading end is chamfered at its periphery, to ease insertion and removal.

23. The combination of claim 17, in which at least the 10 leading end of said fastener is compressible at least radially, and in which said complementary fastener engagement means provides an opening of a size which can accommodate said leading end when said leading end is in its compressed state.

24. The combination of claim 17, in which at least the leading end of said fastener is comprised of several elements which are inwardly radially bendable, and in which said complementary fastener engagement means provides an opening of a size which can accommodate said leading end when said leading end elements are in their inwardly bent state.

25. The combination of claim 17, in which said ring assembly includes a pedestal ring and a focus ring, with each having been configured complementarily to the other to enable both rings to be pressed together for removeable engagement with each other so as to constitute said ring assembly.

26. The combination of claim 17, in which said pedestal peripherally mounts said one or more fasteners, said fasteners protruding axially outwardly away from the processing surface, and in which said ring means is provided with said complementary fastener engagement means.

27. The combination of claim 17, wherein said processing surface is an electrode surface and said at least one pedestal is in electrical contact with said electrode surface.

* * * * *